US006596653B2

(12) United States Patent
Tan et al.

(10) Patent No.: US 6,596,653 B2
(45) Date of Patent: Jul. 22, 2003

(54) HYDROGEN ASSISTED UNDOPED SILICON OXIDE DEPOSITION PROCESS FOR HDP-CVD

(75) Inventors: Zhengquan Tan, Cupertino, CA (US); Dongqing Li, Santa Clara, CA (US); Walter Zygmunt, San Jose, CA (US); Tetsuya Ishikawa, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 3 days.

(21) Appl. No.: 09/854,406

(22) Filed: May 11, 2001

(65) Prior Publication Data

US 2002/0187656 A1 Dec. 12, 2002

(51) Int. Cl.⁷ ............................................. H01L 21/469
(52) U.S. Cl. .................. 438/788; 438/149; 438/758; 438/773; 438/778
(58) Field of Search ............................... 438/149, 758, 438/770, 773, 776, 778, 787, 788

(56) References Cited

U.S. PATENT DOCUMENTS

| | | | |
|---|---|---|---|
| 4,690,746 A | 9/1987 | McInerney et al. | |
| 4,737,379 A * | 4/1988 | Hudgens et al. | 438/788 |
| 4,835,005 A | 5/1989 | Hirooka et al. | 427/38 |
| 4,890,575 A | 1/1990 | Ito et al. | 118/723 |
| 5,645,645 A | 7/1997 | Zhang et al. | |
| 5,712,185 A | 1/1998 | Tsai et al. | |
| 5,719,085 A | 2/1998 | Moon et al. | |
| 5,804,259 A | 9/1998 | Robles | |
| 5,872,058 A | 2/1999 | Van Cleemput et al. | |
| 5,910,342 A | 6/1999 | Hirooka et al. | 427/573 |
| 5,976,327 A | 11/1999 | Tanaka | |
| 5,990,013 A * | 11/1999 | Berenguer et al. | 438/706 |
| 6,013,191 A | 1/2000 | Nasser-Faili et al. | |
| 6,013,584 A | 1/2000 | M'Saad | 438/783 |
| 6,030,881 A | 2/2000 | Papasouliotis et al. | |
| 6,039,851 A | 3/2000 | Iyer | |
| 6,194,038 B1 | 2/2001 | Rossman | |
| 6,217,658 B1 | 4/2001 | Orczyk et al. | |
| 6,228,751 B1 * | 5/2001 | Yamazaki et al. | 438/149 |
| 6,313,010 B1 | 11/2001 | Nag et al. | |
| 6,395,150 B1 * | 5/2002 | Van Cleemput et al. | 204/192.35 |

FOREIGN PATENT DOCUMENTS

| | | |
|---|---|---|
| GB | 2 267 291 A | 12/1993 |
| JP | 2-58836 A | 2/1990 |
| JP | 7-161703 A | 6/1995 |

OTHER PUBLICATIONS

"Handbook of Low and High Dielectric Constant Materials and Their applications", Nalwa, vol. 1, 1999, p66.*
V.Y. Vassiliev et al., "Trends in Void–Free Pre–Metal CVD Dielectrics," *Solid State Technology*, pp. 129–136 (Mar. 2001).
Nalwa, H.S., *Handbook of Low and High Dielectric Constant Materials and Their Applications*, vol. 1, p. 66 (1999).

* cited by examiner

*Primary Examiner*—Kamand Cuneo
*Assistant Examiner*—Lisa Kilday
(74) *Attorney, Agent, or Firm*—Townsend and Townsend and Crew

(57) ABSTRACT

A method of forming a silicon oxide layer over a substrate disposed in a high density plasma substrate processing chamber. The silicon oxide layer is formed by flowing a process gas including a silicon-containing source, an oxygen-containing source, an inert gas and a hydrogen-containing source into the substrate processing chamber and forming a high density plasma (i.e., a plasma having an ion density of at least $1 \times 10^{11}$ ions/cm$^3$) from the process gas to deposit said silicon oxide layer over said substrate. In one embodiment, the hydrogen-containing source in the process gas is selected from the group of $H_2$, $H_2O$, $NH_3$, $CH_4$ and $C_2H_6$.

29 Claims, 6 Drawing Sheets

HYDROGEN ASSISTED UNDOPED SILICON OXIDE DEPOSITION PROCESS FOR HDP-CVD

BACKGROUND OF THE INVENTION

The present invention relates to the manufacture of integrated circuits. More specifically, the invention relates to an improved method of depositing silicon oxide layers for use as insulation layers in such integrated circuits.

One of the primary steps in the fabrication of modern semiconductor devices is the formation of a film, such as a silicon oxide, on a semiconductor substrate. Silicon oxide is widely used as an insulating layer in the manufacture of semiconductor devices. As is well known, a silicon oxide film can be deposited by thermal chemical vapor deposition (CVD) or a plasma-enhanced chemical vapor deposition (PECVD) processes. In a conventional thermal CVD process, reactive gases are supplied to the substrate surface where heat-induced chemical reactions (homogeneous or heterogeneous) take place to produce a desired film. In a conventional plasma process, a controlled plasma is formed to decompose and/or energize reactive species to produce the desired film.

Semiconductor device geometries have dramatically decreased in size since such devices were first introduced several decades ago. Smaller feature sizes have resulted in the presence of increased aspect ratio gaps for some applications, for example, between adjacent conductive lines or in etched trenches. The aspect ratio of a gap is defined by the ratio of the gap's height or depth to its width. These spaces are difficult to fill using conventional CVD methods. A film's ability to completely fill such gaps is referred to as the film's "gap-filling" ability. Silicon oxide is one type of insulation film that is commonly used to fill the gaps in intermetal dielectric (IMD) applications, premetal dielectric (PMD) applications and shallow trench isolation (STI) applications among others. Such a silicon oxide film is often referred to as a gap-fill film or a gap-fill layer.

Some integrated circuit manufacturers have turned to the use of high density plasma CVD (HDP-CVD) systems to deposit silicon oxide gap-fill layers. HDP-CVD systems form a plasma that is approximately two orders of magnitude or greater than the density of a standard, capacitively-coupled plasma CVD system. Examples of HDP-CVD systems include inductively-coupled plasma systems and electron cyclotron resonance (ECR) plasma systems among others. HDP-CVD systems generally operate at lower pressure ranges than low density plasma systems. The low chamber pressure employed in HDP-CVD systems provides active species having a long mean-free-path and reduced angular distribution. These factors, in combination with the plasma's density, contribute to a significant number of constituents from the plasma reaching even the deepest portions of closely spaced gaps, providing a film with improved gap-fill capabilities as compared to films deposited in a low density plasma CVD system.

Another factor that allows films deposited by HDP-CVD techniques to have improved gap-fill characteristics as compared to films deposited by other CVD techniques is the occurrence of sputtering, promoted by the plasma's high density, simultaneous with film deposition. The sputtering element of HDP deposition slows deposition on certain features, such as the corners of raised surfaces, thereby contributing to the increased gap-fill ability of HDP deposited films. Some HDP-CVD systems introduce argon or a similar heavy inert gas to further promote the sputtering effect. These HDP-CVD systems typically employ an electrode within the substrate support pedestal that enables the creation of an electric field to bias the plasma toward the substrate. The electric field can be applied throughout the HDP deposition process to further promote sputtering and provide better gap-fill characteristics for a given film.

One HDP-CVD process commonly used to deposit a silicon oxide film forms a plasma from a process gas that includes silane ($SiH_4$), molecular oxygen ($O_2$) and argon (Ar). This silicon oxide film has improved gap-fill characteristics as opposed to some silicon oxide films deposited by other non-HDP-CVD plasma techniques and is useful for a variety of applications. Despite the improvement in gap-fill capability provided by HDP-CVD systems and the relatively good gap-fill characteristics of HDP-CVD silicon oxide films in particular, the development of film deposition techniques that enable the deposition of silicon oxide layers having even further improved gap-fill characteristics are desirable. Such improved silicon oxide film deposition are particularly desirable in light of the aggressive gap-fill challenges presented by integrated circuit designs employing minimum feature sizes of 0.18 microns and less.

SUMMARY OF THE INVENTION

Embodiments of the present invention pertain to an improved method of depositing silicon oxide films using HDP-CVD deposition techniques. These embodiments enable improved gap-fill capabilities as compared to HDP-CVD silicon oxide deposition techniques that do not employ the method of the present invention and the embodiments are useful for the manufacture of integrated circuits having minimum feature sizes of 0.18 microns or less.

In one embodiment, the present invention forms an undoped silicon oxide layer (USG) over a substrate disposed in a high density plasma substrate processing chamber. The silicon oxide layer is formed by flowing a process gas into the substrate processing chamber and forming a high density plasma (i.e., a plasma having an ion density of at least $1 \times 10^{11}$ ions/cm$^3$) from the process gas to deposit said silicon oxide layer over said substrate. The process gas includes a silane gas, an oxygen-containing source, an inert gas and a hydrogen-containing source that is selected from the group of $H_2$, $H_2O$, $NH_3$, $CH_4$, $C_2H_6$, or a hydride gas that does not include silicon, boron or phosphorus. The deposited silicon oxide layer has a hydrogen content of less than or equal to 2 atomic percent.

In another embodiment, the present invention forms an undoped silicon oxide layer (USG) from a process gas consisting of $SiH_4$, $O_2$, Ar and $H_2$. The flow rate ratio of $O_2$ to the combined flow of $SiH_4$ and $H_2$ in the process gas is between 1.6–2.5:1 inclusive and the flow rate ratio of $H_2$ to $SiH_4$ is between 0.5–2.0:1 inclusive. The process gas is flowed into the substrate processing chamber and a high density plasma is formed from the process gas to deposit the silicon oxide layer over the substrate. The deposited silicon oxide layer has a dielectric constant of between 4.0 and 4.2 and contains less than or equal to 2 atomic percent hydrogen.

These and other embodiments of the present invention, as well as its advantages and features are described in more detail in conjunction with the text below and attached figures.

DESCRIPTION OF THE SPECIFIC EMBODIMENTS

I. Introduction

Embodiments of the present invention deposit an improved silicon oxide layer using high density plasma CVD techniques. The deposited layer has improved gap-fill capabilities as compared to some prior art silicon oxide deposition techniques. Films deposited by the method of the present invention are suitable for use in the fabrication of integrated circuits having feature sizes of 0.18 microns or less.

Embodiments of the present invention can be implemented using a variety of high density plasma CVD substrate processing chambers including chambers in which a plasma is formed by the application of RF energy to a coil that at least partially surrounds a portion of the chamber and chambers that use ECR plasma formation techniques. An example of an inductively-coupled HDP-CVD chamber in which embodiments of the method of the present invention can be practiced is set forth below.

II. Exemplary Substrate Processing System

Figure 1A:
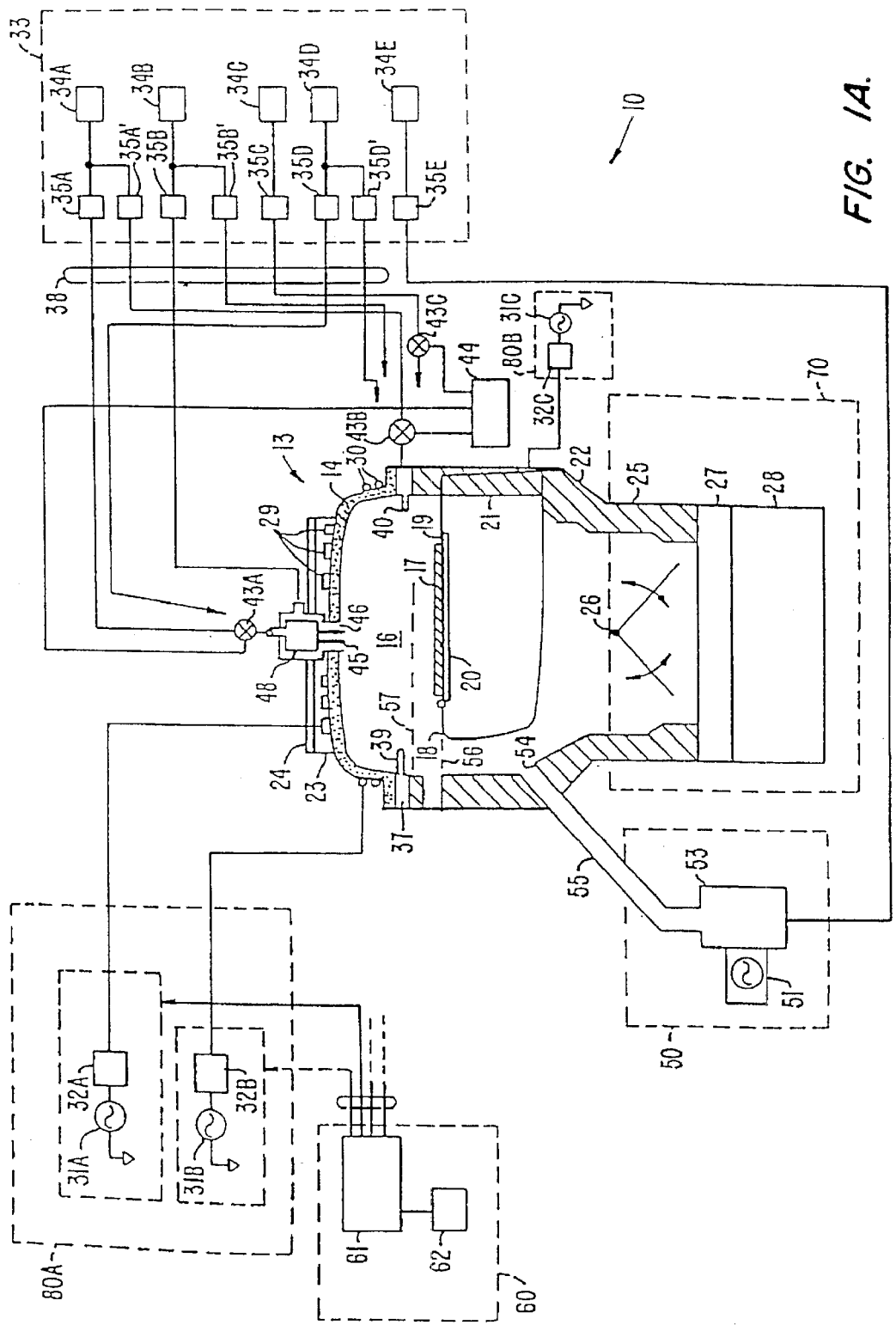
FIG. 1A is a simplified diagram of one embodiment of a high density chemical vapor deposition system according to the present invention.

FIG. 1A illustrates one embodiment of a high density plasma chemical vapor deposition (HDP-CVD) system 10 in which a dielectric layer according to the present invention can be deposited. System 10 includes a chamber 13, a vacuum system 70, a source plasma system 80A, a bias plasma system 80B, a gas delivery system 33, and a remote plasma cleaning system 50.

The upper portion of chamber 13 includes a dome 14, which is made of a ceramic dielectric material, such as aluminum oxide or aluminum nitride. Dome 14 defines an upper boundary of a plasma processing region 16. Plasma processing region 16 is bounded on the bottom by the upper surface of a substrate 17 and a substrate support 18.

A heater plate 23 and a cold plate 24 surmount, and are thermally coupled to, dome 14. Heater plate 23 and cold plate 24 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

Generally, exposure to the plasma heats a substrate positioned on substrate support 18. Substrate support 18 includes inner and outer passages (not shown) that can deliver a heat transfer gas (sometimes referred to as a backside cooling gas) to the backside of the substrate.

The lower portion of chamber 13 includes a body member 22, which joins the chamber to the vacuum system. A base portion 21 of substrate support 18 is mounted on, and forms a continuous inner surface with, body member 22. Substrates are transferred into and out of chamber 13 by a robot blade (not shown) through an insertion/removal opening (not shown) in the side of chamber 13. Lift pins (not shown) are raised and then lowered under the control of a motor (also not shown) to move the substrate from the robot blade at an upper loading position 57 to a lower processing position 56 in which the substrate is placed on a substrate receiving portion 19 of substrate support 18. Substrate receiving portion 19 includes an electrostatic chuck 20 that secures the substrate to substrate support 18 during substrate processing. In a preferred embodiment, substrate support 18 is made from an aluminum oxide or aluminum ceramic material.

Vacuum system 70 includes throttle body 25, which houses twin-blade throttle valve 26 and is attached to gate valve 27 and turbo-molecular pump 28. It should be noted that throttle body 25 offers minimum obstruction to gas flow, and allows symmetric pumping, as described in co-pending, co-assigned U.S. patent application Ser. No. 08/574,839, filed Dec. 12, 1995, and which is incorporated herein by reference. Gate valve 27 can isolate pump 28 from throttle body 25, and can also control chamber pressure by restricting the exhaust flow capacity when throttle valve 26 is fully open. The arrangement of the throttle valve, gate valve, and turbo-molecular pump allow accurate and stable control of chamber pressures from between about 1 mTorr to about 2 Torr.

The source plasma system 80A includes a top coil 29 and side coil 30, mounted on dome 14. A symmetrical ground shield (not shown) reduces electrical coupling between the coils. Top coil 29 is powered by top source RF (SRF) generator 31A, whereas side coil 30 is powered by side SRF generator 31B, allowing independent power levels and frequencies of operation for each coil. This dual coil system allows control of the radial ion density in chamber 13, thereby improving plasma uniformity. Side coil 30 and top coil 29 are typically inductively driven, which does not require a complimentary electrode. In a specific embodiment, the top source RF generator 31A provides up to 2,500 watts of RF power at nominally 2 MHz and the side source RF generator 31B provides up to 5,000 watts of RF power at nominally 2 MHz. The operating frequencies of the top and side RF generators may be offset from the nominal operating frequency (e.g. to 1.7–1.9 MHz and 1.9–2.1 MHz, respectively) to improve plasma-generation efficiency.

A bias plasma system 80B includes a bias RF (BRF) generator 31C and a bias matching network 32C. The bias plasma system 80B capacitively couples substrate portion 17 to body member 22, which act as complimentary electrodes. The bias plasma system 80B serves to enhance the transport of plasma species (e.g., ions) created by the source plasma system 80A to the surface of the substrate. In a specific embodiment, bias RF generator provides up to 5,000 watts of RF power at 13.56 MHz.

RF generators 31A and 31B include digitally-controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 32A and 32B match the output impedance of generators 31A and 31B with their respective coils 29 and 30. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition. Other measures may also help stabilize a plasma. For example, the RF control circuit can be used to determine the power delivered to the load (plasma) and may increase or decrease the generator output power to keep the delivered power substantially constant during deposition of a layer.

Figure 1B:
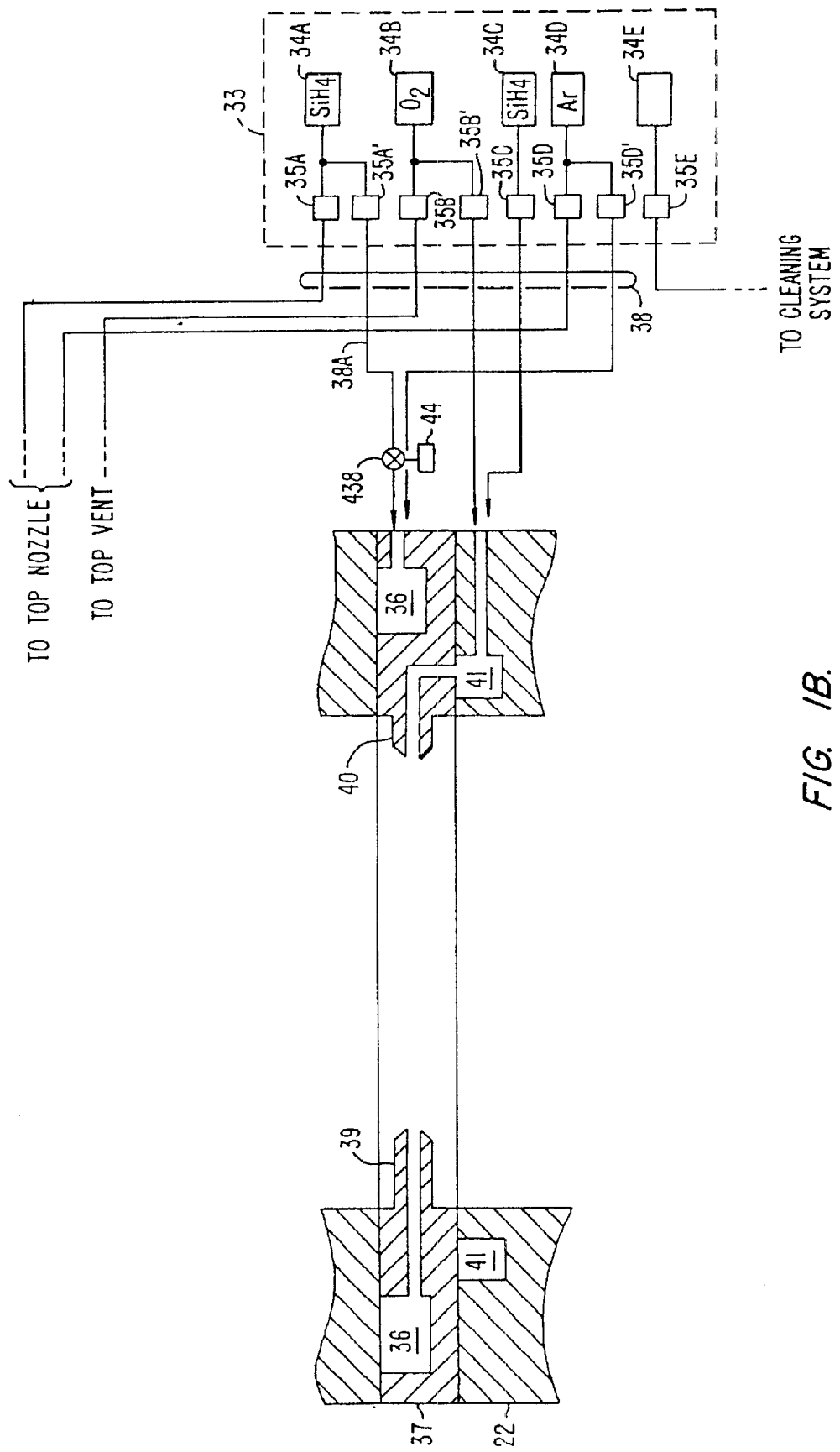
FIG. 1B is a simplified cross section of a gas ring that may be used in conjunction with the exemplary CVD processing chamber of FIG. 1A.

A gas delivery system 33 provides gases from several sources, 34A–34F chamber for processing the substrate via gas delivery lines 38 (only some of which are shown). As would be understood by a person of skill in the art, the actual sources used for sources 34A–34F and the actual connection of delivery lines 38 to chamber 13 varies depending on the deposition and cleaning processes executed within chamber 13. Gases are introduced into chamber 13 through a gas ring 37 and/or a top nozzle 45. FIG. 1B is a simplified, partial cross-sectional view of chamber 13 showing additional details of gas ring 37.

In one embodiment, first and second gas sources, 34A and 34B, and first and second gas flow controllers, 35A' and 35B', provide gas to ring plenum 36 in gas ring 37 via gas delivery lines 38 (only some of which are shown). Gas ring 37 has a plurality of gas nozzles 39 (only one of which is shown for purposes of illustration) that provide a uniform flow of gas over the substrate. Nozzle length and nozzle angle may be changed to allow tailoring of the uniformity profile and gas utilization efficiency for a particular process within an individual chamber. In a preferred embodiment, gas ring 37 has 12 gas nozzles 39 made from an aluminum oxide ceramic.

Gas ring 37 also has a plurality of gas nozzles 40 (only one of which is shown), which in a preferred embodiment are co-planar with and shorter than source gas nozzles 39, and in one embodiment receive gas from body plenum 41. Gas nozzles 39 and 40 are not fluidly coupled in some embodiments it is desirable not to mix gases before injecting the gases into chamber 13. In other embodiments, gases may be mixed prior to injecting the gases into chamber 13 by providing apertures (not shown) between body plenum 41 and gas ring plenum 36. In one embodiment, third and fourth gas sources, 34C and 34D, and third and fourth gas flow controllers, 35C and 35D', provide gas to body plenum via gas delivery lines 38. Additional valves, such as 43B (other valves not shown), may shut off gas from the flow controllers to the chamber.

In embodiments where flammable, toxic, or corrosive gases are used, it may be desirable to eliminate gas remaining in the gas delivery lines after a deposition. This may be accomplished using a 3-way valve, such as valve 43B, to isolate chamber 13 from delivery line 38A and to vent delivery line 38A to vacuum foreline 44, for example. As shown in FIG. 1A, other similar valves, such as 43A and 43C, may be incorporated on other gas delivery lines. Such 3-way valves may be placed as close to chamber 13 as practical, to minimize the volume of the unvented gas delivery line (between the 3-way valve and the chamber). Additionally, two-way (on-off) valves (not shown) may be placed between a mass flow controller ("MFC") and the chamber or between a gas source and an MFC.

Referring again to FIG. 1A, chamber 13 also has top nozzle 45 and top vent 46. Top nozzle 45 and top vent 46 allow independent control of top and side flows of the gases, which improves film uniformity and allows fine adjustment of the film's deposition and doping parameters. Top vent 46 is an annular opening around top nozzle 45. In one embodiment, first gas source 34A supplies source gas nozzles 39 and top nozzle 45. Source nozzle MFC 35A' controls the amount of gas delivered to source gas nozzles 39 and top nozzle MFC 35A controls the amount of gas delivered to top gas nozzle 45. Similarly, two MFCs 35B and 35B' may be used to control the flow of oxygen to both top vent 46 and oxidizer gas nozzles 40 from a single source of oxygen, such as source 34B. The gases supplied to top nozzle 45 and top vent 46 may be kept separate prior to flowing the gases into chamber 13, or the gases may be mixed in top plenum 48 before they flow into chamber 13. Separate sources of the same gas may be used to supply various portions of the chamber.

A remote microwave-generated plasma cleaning system 50 is provided to periodically clean deposition residues from chamber components. The cleaning system includes a remote microwave generator 51 that creates a plasma from a cleaning gas source 34E (e.g., molecular fluorine, nitrogen trifluoride, other fluorocarbons or equivalents) in reactor cavity 53. The reactive species resulting from this plasma are conveyed to chamber 13 through cleaning gas feed port 54 via applicator tube 55. The materials used to contain the cleaning plasma (e.g., cavity 53 and applicator tube 55) must be resistant to attack by the plasma. The distance between reactor cavity 53 and feed port 54 should be kept as short as practical, since the concentration of desirable plasma species may decline with distance from reactor cavity 53. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 20, do not need to be covered with a dummy wafer or otherwise protected, as may be required with an in situ plasma cleaning process.

System controller 60 controls the operation of system 10. In a preferred embodiment, controller 60 includes a memory 62, such as a hard disk drive, a floppy disk drive (not shown), and a card rack (not shown) coupled to a processor 61. The card rack may contain a single-board computer (SBC) (not shown), analog and digital input)output boards (not shown), interface boards (not shown), and stepper motor controller boards (not shown). The system controller conforms to the Versa Modular European (VME) standard, which defines board, card cage, and connector dimensions and types. The VME standard also defines the bus structure as having a 16-bit data bus and 24-bit address bus. System controller 60 operates under the control of a computer program stored on the hard disk drive or through other computer programs, such as programs stored on a removable disk. The computer program dictates, for example, the timing, mixture of gases, RF power levels and other parameters of a particular process. The interface between a user and the system controller is via a monitor, such as a cathode ray tube (CRT) 65, and a light pen 66, as depicted in FIG. 1C.

Figure 1C:
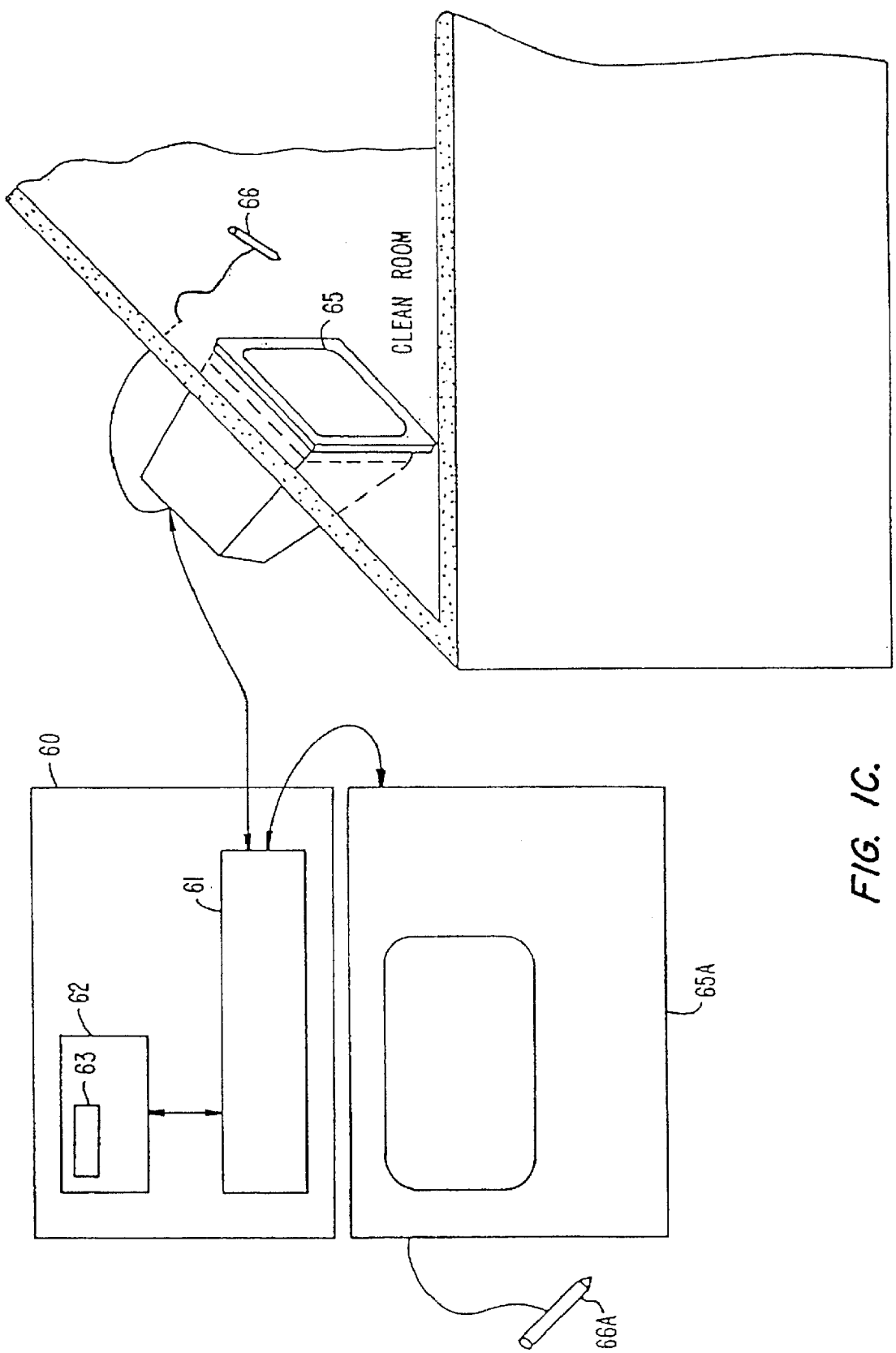
FIG. 1C is a simplified diagram of a monitor and light pen that may be used in conjunction with the exemplary CVD processing chamber of FIG. 1A.

FIG. 1C is an illustration of a portion of an exemplary system user interface used in conjunction with the exemplary CVD processing chamber of FIG. 1A. System controller 60 includes a processor 61 coupled to a computer-readable memory 62. Preferably, memory 62 may be a hard disk drive, but memory 62 may be other kinds of memory, such as ROM, PROM, and others.

System controller 60 operates under the control of a computer program 63 stored in a computer-readable format within memory 62. The computer program dictates the timing, temperatures, gas flows, RF power levels and other parameters of a particular process. The interface between a user and the system controller is via a CRT monitor 65 and a light pen 66, as depicted in FIG. 1C. In a preferred embodiment, two monitors, 65 and 65A, and two light pens, 66 and 66A, are used, one mounted in the clean room wall (65) for the operators and the other behind the wall (65A) for the service technicians. Both monitors simultaneously display the same information, but only one light pen (e.g. 66) is enabled. To select a particular screen or function, the operator touches an area of the display screen and pushes a button (not shown) on the pen. The touched area confirms being selected by the light pen by changing its color or displaying a new menu, for example.

The computer program code can be written in any conventional computer-readable programming language such as 68000 assembly language, C, C++, or Pascal. Suitable program code is entered into a single file, or multiple files, using a conventional text editor and is stored or embodied in a computer-usable medium, such as a memory system of the computer. If the entered code text is in a high level language, the code is compiled, and the resultant compiler code is then linked with an object code of precompiled windows library routines. To execute the linked compiled object code, the system user invokes the object code causing the computer system to load the code in memory. The CPU reads the code from memory and executes the code to perform the tasks identified in the program.

Figure 1D:
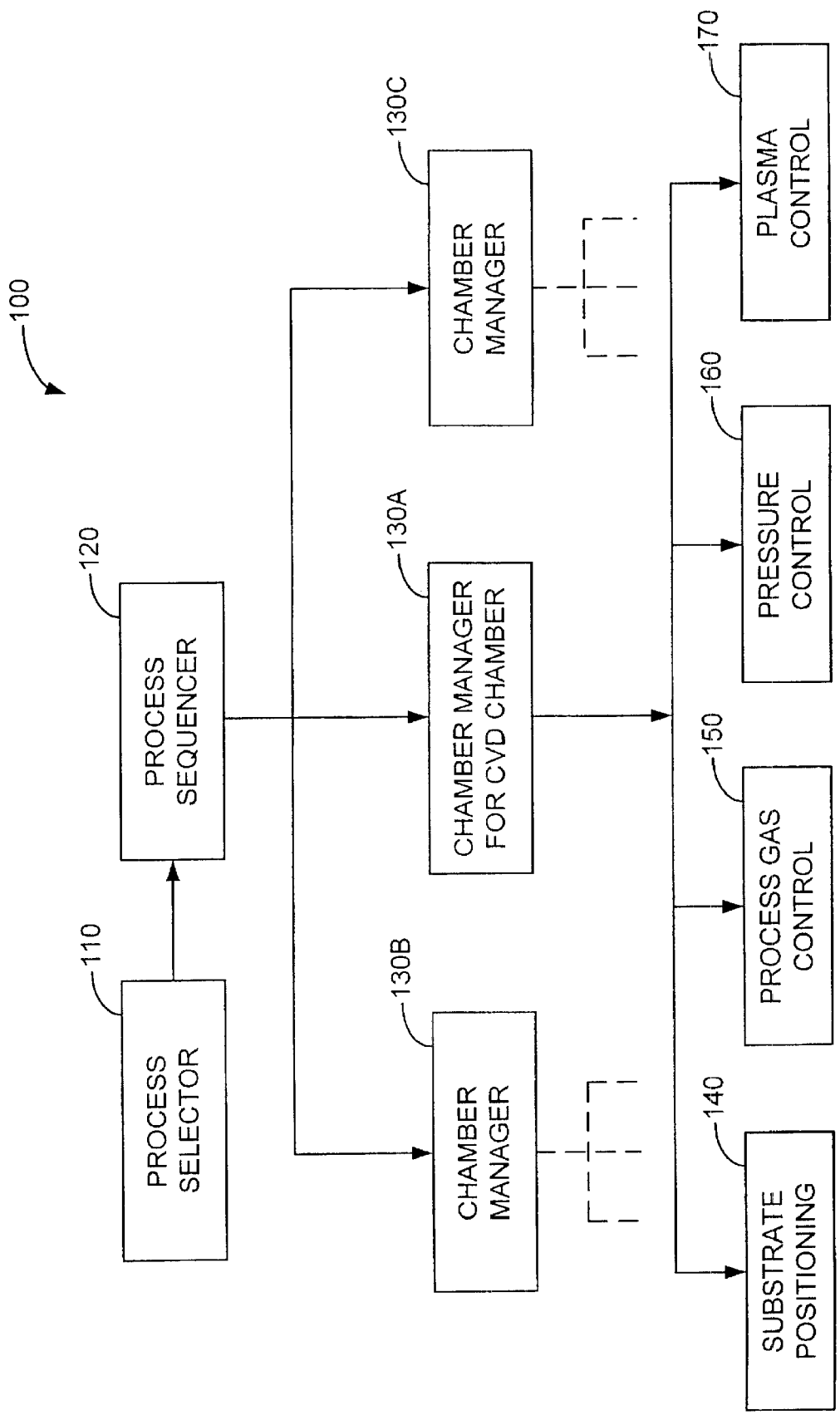
FIG. 1D is a flow chart of an exemplary process control computer program product used to control the exemplary CVD processing chamber of FIG. 1A.

FIG. 1D shows an illustrative block diagram of the hierarchical control structure of computer program 100. A user enters a process set number and process chamber number into a process selector subroutine 110 in response to menus or screens displayed on the CRT monitor by using the light pen interface. The process sets are predetermined sets of process parameters necessary to carry out specified processes, and are identified by predefined set numbers. Process selector subroutine 110 identifies (i) the desired process chamber in a multichamber system, and (ii) the desired set of process parameters needed to operate the process chamber for performing the desired process. The process parameters for performing a specific process relate to conditions such as process gas composition and flow rates, temperature, pressure, plasma conditions such as RF power levels, and chamber dome temperature, and are provided to the user in the form of a recipe. The parameters specified by the recipe are entered utilizing the light pen/CRT monitor interface.

The signals for monitoring the process are provided by the analog and digital input boards of system controller 60, and the signals for controlling the process are output on the analog and digital output boards of system controller 60.

A process sequencer subroutine 120 comprises program code for accepting the identified process chamber and set of process parameters from the process selector subroutine 110 and for controlling operation of the various process chambers. Multiple users can enter process set numbers and process chamber numbers, or a single user can enter multiple process set numbers and process chamber numbers; sequencer subroutine 120 schedules the selected processes in the desired sequence. Preferably, sequencer subroutine 120 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 120 can be designed to take into consideration the "age of each particular user-entered request, or the present condition of the process chamber being used in comparison with the desired process conditions for a selected process, or any other relevant factor a system programmer desires to include for determining scheduling priorities.

After sequencer subroutine 120 determines which process chamber and process set combination is going to be executed next, sequencer subroutine 120 initiates execution of the process set by passing the particular process set parameters to a chamber manager subroutine 130A–C, which controls multiple processing tasks in chamber 13 and possibly other chambers (not shown) according to the process set sent by sequencer subroutine 120.

Examples of chamber component subroutines are substrate positioning subroutine 140, process gas control subroutine 150, pressure control subroutine 160, and plasma control subroutine 170. Those having ordinary skill in the art will recognize that other chamber control subroutines can be included depending on what processes are selected to be performed in chamber 13. In operation, chamber manager subroutine 130A selectively schedules or calls the process component subroutines in accordance with the particular process set being executed. Chamber manager subroutine 130A schedules process component subroutines in the same manner that sequencer subroutine 120 schedules the process chamber and process set to execute. Typically, chamber manager subroutine 130A includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIGS. 1A and 1D. Substrate positioning subroutine 140 comprises program code for controlling chamber components that are used to load a substrate onto substrate support number 18. Substrate positioning subroutine 140 may also control transfer of a substrate into chamber 13 from, e.g., a PECVD reactor or other reactor in the multi-chamber system, after other processing has been completed.

Process gas control subroutine 150 has program code for controlling process gas composition and flow rates. Subroutine 150 controls the open/close position of the safety shut-off valves and also ramps up/ramps down the mass flow controllers to obtain the desired gas flow rates. All chamber component subroutines, including process gas control subroutine 150, are invoked by chamber manager subroutine 130A. Subroutine 150 receives process parameters from chamber manager subroutine 130A related to the desired gas flow rates.

Typically, process gas control subroutine 150 opens the gas supply lines, and repeatedly (i) reads the necessary mass flow controllers, (ii) compares the readings to the desired flow rates received from chamber manager subroutine 130A, and (iii) adjusts the flow rates of the gas supply lines as necessary. Furthermore, process gas control subroutine 150 may include steps for monitoring the gas flow rates for unsafe rates and for activating the safety shut-off valves when an unsafe condition is detected.

In some processes, an inert gas, such as argon, is flowed into chamber 13 to stabilize the pressure in the chamber before reactive process gases are introduced. For these processes, the process gas control subroutine 150 is programmed to include steps for flowing the inert gas into chamber 13 for an amount of time necessary to stabilize the pressure in the chamber. The steps described above may then be carried out.

Additionally, when a process gas is to be vaporized from a liquid precursor, for example, tetraethylorthosilane (TEOS), the process gas control subroutine 150 may include steps for bubbling a delivery gas such as helium through the liquid precursor in a bubbler assembly or for introducing the helium to a liquid injection valve. For this type of process, the process gas control subroutine 150 regulates the flow of the delivery gas, the pressure in the bubbler, and the bubbler temperature to obtain the desired process gas flow rates. As discussed above, the desired process gas flow rates are transferred to process gas control subroutine 150 as process parameters.

Furthermore, the process gas control subroutine 150 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The process gas control subroutine 150 may also control the flow of heat-transfer gas, such as helium (He), through the inner and outer passages in the wafer chuck with an independent helium control (IHC) subroutine (not shown). The gas flow thermally couples the substrate to the chuck. In a typical process, the wafer is heated by the plasma and the chemical reactions that form the layer, and the He cools the substrate through the chuck, which may be water-cooled. This keeps the substrate below a temperature that may damage preexisting features on the substrate.

Pressure control subroutine 160 includes program code for controlling the pressure in chamber 13 by regulating the size of the opening of throttle valve 26 in the exhaust portion of the chamber. There are at least two basic methods of controlling the chamber with the throttle valve. The first method relies on characterizing the chamber pressure as it relates to, among other things, the total process gas flow, the size of the process chamber, and the pumping capacity. The first method sets throttle valve 26 to a fixed position. Setting throttle valve 26 to a fixed position may eventually result in a steady-state pressure.

Alternatively, the chamber pressure may be measured, with a manometer for example, and the position of throttle valve 26 may be adjusted according to pressure control subroutine 160, assuming the control point is within the boundaries set by gas flows and exhaust capacity. The former method may result in quicker chamber pressure changes, as the measurements, comparisons, and calculations associated with the latter method are not invoked. The former method may be desirable where precise control of the chamber pressure is not required, whereas the latter method may be desirable where an accurate, repeatable, and stable pressure is desired, such as during the deposition of a layer.

When pressure control subroutine 160 is invoked, the desired, or target, pressure level is received as a parameter from chamber manager subroutine 130A. Pressure control subroutine 160 measures the pressure in chamber 13 by reading one or more conventional pressure manometers connected to the chamber; compares the measured value(s) to the target pressure; obtains proportional, integral, and differential (PID) values from a stored pressure table corresponding to the target pressure, and adjusts throttle valve 26 according to the PID values obtained from the pressure table. Alternatively, pressure control subroutine 160 may open or close throttle valve 26 to a particular opening size to regulate the pressure in chamber 13 to a desired pressure or pressure range.

Plasma control subroutine 170 comprises program code for controlling the frequency and power output setting of RF generators 31A and 31B and for tuning matching networks 32A and 32B. Plasma control subroutine 170, like the previously described chamber component subroutines, is invoked by chamber manager subroutine 130A.

An example of a system that may incorporate some or all of the subsystems and routines described above would be the ULTIMA™ system, manufactured by APPLIED MATERIALS, INC., of Santa Clara, Calif., configured to practice the present invention. Further details of such a system are disclosed in U.S. Pat. No. 6,170,428, issued Jan. 9, 2001, entitled "Symmetric Tunable Inductively-Coupled HDP-CVD Reactor," having Fred C. Redeker, Farhad Moghadam, Hirogi Hanawa, Tetsuya Ishikawa, Dan Maydan, Shijian Li, Brian Lue, Robert Steger, Yaxin Wang, Manus Wong and Ashok Sinha listed as co-inventors, the disclosure of which is incorporated herein by reference. The described system is for exemplary purpose only. It would be a matter of routine skill for a person of skill in the art to select an appropriate conventional substrate processing system and computer control system to implement the present invention.

Figure 2:
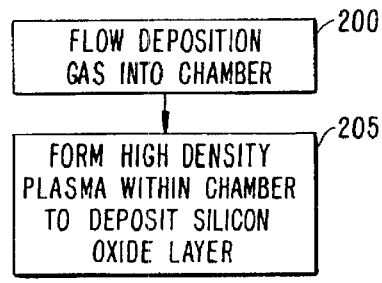
FIG. 2 is a flowchart illustrating one embodiment of the method of the present invention.

III. Depositing a Silicon Oxide Film According to Specific Embodiments of the Invention As previously stated, embodiments of the present invention can be practiced in an HDP-CVD chamber such as exemplary chamber 13 described above. FIG. 2 illustrates one particular embodiment of the invention as used to deposit a silicon oxide film over a semiconductor substrate. The process is for exemplary purposes and is not intended to limit the scope of the claims of the present invention. Where applicable, reference numbers in the description below are used to refer to appropriate components of the exemplary chamber of FIGS. 1A–1D. In this embodiment the process is implemented and controlled using a computer program stored in the memory 62 of system controller 60.

The method shown in FIG. 2 deposits an undoped silicon oxide layer by flowing a process gas into chamber 1 (step 200) and forming a plasma from the process gas (step 205). The length of the deposition process is determined by the desired thickness of the silicon oxide film.

One manner in which the deposition process shown in FIG. 2 differs from previous HDP-CVD silicon oxide deposition processes is by adding a flow of a hydrogen-containing source to the traditional silicon oxide deposition gas. As is known to those of skill in the art, an HCP-CVD silicon oxide film is generally deposited from a process gas that includes a silane gas (e.g., $SiH_4$, $Si_2H_6$, etc.), an oxygen-containing source (e.g., $O_2$) and an inert gas (e.g., Ar). Generally, deposition conditions for such a silicon oxide film are carefully controlled in order to minimize the amount of hydrogen incorporated into the film because as is known to those of skill in the art, hydrogen is a source of film instability. The inventors have unexpectedly discovered, however, that adding a flow of a hydrogen-containing gas in step 200 can increase the gap-fill capability of the film without leading to film instability provided other deposition conditions are maintained within certain ranges as described in more detail below. In various embodiments, the hydrogen-containing gas can be one or more of the following: molecular hydrogen ($H_2$), water ($H_2O$), ammonia ($NH_3$), methane ($CH_4$), ethane ($C_2H_6$) or another hydride gas that does not include silicon, boron or phosphorus. Using a hydride that includes boron or phosphorus (e.g., $PH_3$ or $B_2H_6$) would result in the inclusion of boron or phosphorus, respectively, in the film and thus produce a BSG or PSG film as opposed to a USG film. In one particular embodiment, the process gas consists of $SiH_4$, $O_2$, Ar and $H_2$.

In order to better appreciate the benefits achievable by the hydrogen-assisted silicon oxide deposition process shown in FIG. 2 it is useful to first understand some of the problems associated with a well known previously used HDP-CVD silicon oxide deposition process. This well known process deposits an undoped silicon oxide film from a process gas of $SiH_4$, $O_2$ and Ar and can be implemented in the exemplary chamber described above. One specific process that has been recommended in the past for PMD gap-fill applications employs the deposition conditions shown below in Table 1.

TABLE 1

PREVIOUSLY KNOWN HDP-CVD $SiO_2$ DEPOSITION PROCESS

| Parameter | Value |
| --- | --- |
| $SiH_4$ flow | 60 + 11 sccm |
| $O_2$ flow | 140 sccm |

TABLE 1-continued

PREVIOUSLY KNOWN HDP-CVD $SiO_2$ DEPOSITION PROCESS

| Parameter | Value |
| --- | --- |
| Ar flow | 80 + 12 sccm |
| Pressure | 2–4 mTorr (TVO) |
| Temperature | 550° C. |
| Top RF Power | 4900 Watts |
| Side RF Power | 3000 Watts |
| Bias RF Power | 2000 Watts |

For the gas flow entries within table 1 that include two numbers the first number indicates the flow rate of the particular gas through side nozzles 39, 40 while the second number indicates the flow rate of the gas through top nozzle 45. Also, TVO means "throttle valve fully open" which results in chamber pressure being controlled by the quantity of gas flowed into the chamber.

Figure 3A:
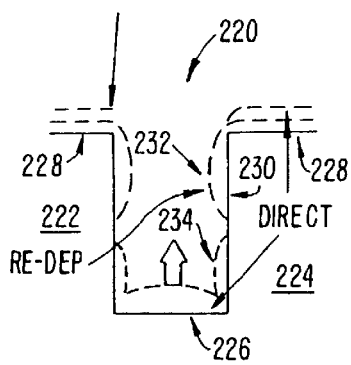
FIGS. 3A–3C are simplified cross-sectional views of a silicon oxide film at different stages of deposition within a narrow width, high aspect ratio gap according to a prior art silicon oxide deposition process.
Figure 3B:
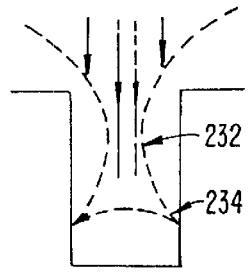
Figure 3C:
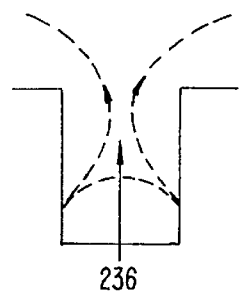

FIGS. 3A–3C, which are simplified cross-sectional views of a silicon oxide film at different stages of deposition, illustrate the potential gap-fill limitation that is associated with the process recipe of Table 1 for certain small width gaps having relatively high aspect ratios. It is important to understand that while HDP-CVD silicon oxide deposition techniques generally provide for improved gap-fill as compared to other plasma silicon oxide deposition techniques including low density, capacitively coupled plasma CVD techniques, the gap-fill issues associated with those techniques become an issue for HDP-CVD techniques in certain aggressive gap-fill applications, for example, gaps having a width of 0.1 μm and a 5:1 aspect ratio. The gap-fill problem illustrated in FIGS. 3A–3C is somewhat exaggerated in order to better illustrate the problem.

FIG. 3A shows the initial stages of film deposition over a substrate (not shown) having a gap 220 defined by two adjacent features 222, 224 formed over the substrate. As shown in FIG. 3A, the conventional HDP-CVD silicon oxide deposition process results in direct silicon oxide deposition on horizontal surface 226 within gap 220 and horizontal surfaces 228 above features 222, 224. The process also results in indirect deposition (referred to as re-deposition) of silicon oxide on sidewalls 230 due to the recombination of material sputtered from the silicon oxide film as it grows. In certain small-width, high-aspect-ratio applications, the continued growth of the silicon oxide film results in formations 232 on the upper section gap sidewall that grow toward each other at a rate of growth exceeding the rate at which the film grows laterally on lower portions 234 of the sidewall (see FIG. 3B also). The final result of this process is that a void 236 forms as shown in FIG. 3C.

Figure 4A:
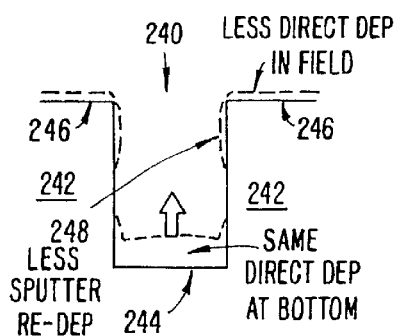
FIGS. 4A–4C are simplified cross-sectional views of a silicon oxide film, deposited according to an embodiment of the present invention, at different stages of deposition within the same narrow width, high aspect ratio gap shown in FIGS. 4A–4C.
Figure 4B:
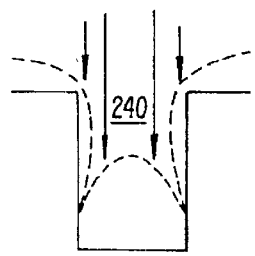
Figure 4C:
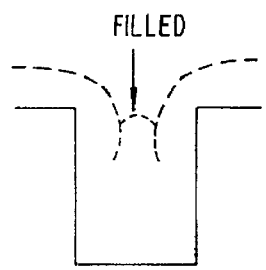

The deposition process discussed with respect to FIG. 2 has improved gap-fill capabilities as compared to those of the conventional film outlined in Table 1. FIGS. 4A–4C illustrate how a film deposited according to the process of FIG. 2 is able to completely fill a gap 240 where the film of Table 1 was not capable of filling the gap in a void-free manner. Each of FIGS. 4A–4C represents growth of the silicon oxide film deposited according to FIG. 2 at the same point in the deposition process as the corresponding one of FIGS. 3A–3C. For example, each of FIGS. 3A and 4A may represent film growth after 10 seconds. It is important to note, however, that none of FIGS. 3A–3C or 4A–4C are intended to be drawn to scale and the actual aspect ratio of the gaps represented in these figures is higher than it appears to be if measuring the figures.

As shown in FIG. 4A, an HDP-CVD silicon oxide film deposited according to the process of FIG. 2 grows on a horizontal surface 244 within gap 240 at approximately the same rate as the film discussed with respect to FIG. 3A. Film growth on horizontal surfaces 246 on top of feature 242, however, is slower than film growth on surfaces 228 in FIG. 3A. Similarly, film growth or re-deposition on an upper portion 248 of the gap sidewall is glower than in FIG. 3A.

As shown in FIGS. 4B and 4C, these differences in film growth rate result in a more even growth within small-width, high aspect ratio gap 240 without the tendency to form an undesirable void within the gap. While not being limited to any particular theory, it is believed that the process of FIG. 2 achieves superior gap-fill results because deposition conditions result in excessive hydrogen cations ($H^+$) on the surface of the sidewall. These excessive hydrogen cations take the place of some silane cations ($SiH_x^+$) on the surface of the sidewall and readily react with oxygen anions ($O^-$) to form volatile $H_2O$ that is pumped out of the chamber. This reaction reduces the amount of O sputtering, which in turn reduces $SiO_2$ deposition on the sidewall because sidewall deposition, especially for trenches with a vertical sidewall, is largely initiated by sputter re-deposition. Thus less $SiO_2$ is deposited on the sidewall than in processes that do not employ the techniques of the present invention.

The inventors have found that in order to deposit a hydrogen-assisted HDP-CVD silicon oxide film so that the deposited film does not include increased levels of hydrogen which could lead to film instability the ratio of the flow rate of the oxygen-containing source to the combined flow rate of the silane gas and hydrogen-containing gas in some embodiments should be between 1.6 and 2.5 to 1 inclusive. At ratios below 1.6:1 the silicon oxide film becomes silicon rich, exhibits poor electrical breakdown characteristics and has an undesirably high refractive index. At ratios above 1.6:1, the relatively high gas flow rates required to achieve such ratios increases the chamber pressure to undesirably high levels which in turn degrades film gap-fill capabilities.

Also, the ratio of the flow rate of the hydrogen-containing gas to the silane gas in some embodiments should be between 0.5–2.0:1 inclusive. At ratios below 0.5:1, not enough additional hydrogen is introduced to achieve desirable gap-fill benefits, and at ratios higher than 2.0:1, the relatively high gas flow rates required to achieve such ratios increases the chamber pressure to undesirably high levels which in turn degrades film gap-fill capabilities.

The method of the present invention is particularly useful for the deposition of undoped silicon oxide layers for PMD and STI applications. Each of these applications often involve gap-fill requirements that are more aggressive, i.e., higher aspect ratio gaps, than IMD applications. Thus, the deposition process of many embodiments of the invention occurs at a substrate temperature above 450° C. and more typically between 500° C. and 750° C. Films deposited according to these embodiments generally have a hydrogen content, as measured by Auger analysis, of between 1.5–1.6 atomic percent. This is comparable to about 1.5 at. % hydrogen content of a standard HDP-CVD USG film deposited from a process gas of $SiH_4$, $O_2$ and Ar using the parameters of Table 1.

Figure 5A:
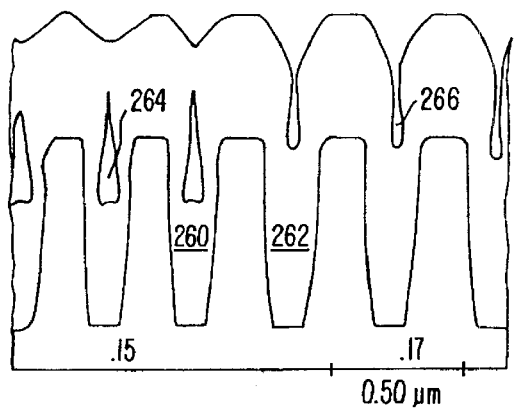
FIGS. 5A and 5B are a simplified cross-sectional view of the gap-fill capability of a silicon oxide film deposited according to a previously known HDP-CVD process.
Figure 5B:
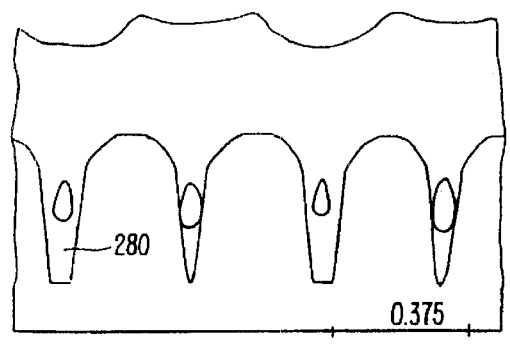

A comparison of FIGS. 6A and 6B to FIGS. 5A and 5B illustrates the benefits of a deposition process according to FIG. 2 as compared to a process according to Table 1. FIGS. 5A and 5B are a simplified cross-sectional view of a silicon oxide film deposited according to the process of Table 1. In FIG. 5A, the film is deposited over a substrate having multiple sets of raised features defining 0.15 µm wide gaps 260 and 0.17 µm wide gaps 262. The height of gaps 260 and 262 is 0.7 µm so the aspect ratio of gaps 260 is approximately 4.7:1 while the aspect ratio of gaps 262 is approximately 4.1:1. As evident from FIG. 5A, the silicon oxide film is not able to completely fill gaps 260 without the formation of voids 264 within the gaps. Similarly, while no voids are formed within gaps 262, the deposition process results in a surface topology that includes unfilled areas 266 near the upper strata of gap 262.

Figure 6A:
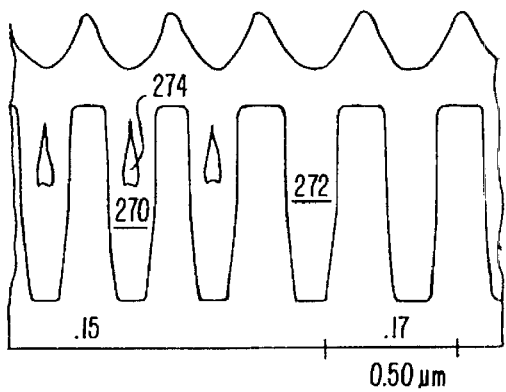
FIGS. 6A and 6B are a simplified cross-sectional view of the gap-fill capability of a silicon oxide film deposited, according to an embodiment of the present invention, over the same gaps as those shown in FIGS. 5A and 5B.

In contrast, FIG. 6A shows deposition of an HDP-CVD silicon oxide film according to the process of FIG. 2 over 0.15 µm and 0.17 µm gaps 270 and 272 having aspect ratios identical to the respective gaps in FIG. 5A. As evident from FIG. 6A, the film deposited according to the process of FIG. 2 has superior gap-fill capabilities as compared to the film of FIG. 5A. Gaps 272 are completely filled without voids and voids 274 within gaps 270 are smaller than voids 264 within gaps 260.

Figure 6B:
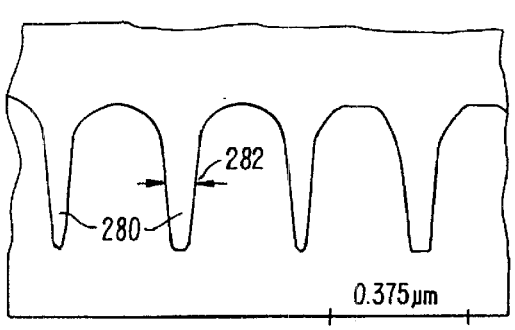

Further evidence of the superiority of the process of FIG. 2 as compared to that of Table 1 is evident from a comparison of FIG. 6B to FIG. 5B. The substrates shown in FIGS. 5B and 6B include trenches 280 having a widths of 0.1 µm at the top of the trench and a width as low as 0.02 µm at the bottom of the trench. The midpoint 282 of trenches 280 has a width of about 0.05 µm and the height of the trenches is 0.4 µm. Using the width of the trench at midpoint 282 to calculate its aspect ratios, as is commonly done, the aspect ratio of trenches 280 is 8.0:1. As evident from the figures, however, the film deposited according to the process of FIG. 2 (FIG. 6B) does not include any voids within the gaps and thus has superior gap-fill capabilities as compared to the film deposited according to the process of Table 1 (FIG. 5B).

The process parameters set forth above with respect to the embodiments above are optimized for particular deposition processes run in an Ultima HDP chamber manufactured by Applied Materials that is outfitted for 200 mm wafers. A person of ordinary skill in the art will recognize that these preferred parameters are in part chamber specific and will vary if chambers of other design and/or volume are employed.

The parameters listed in the above preferred processes and the above-described experiments should not be limiting to the claims as described herein. One of ordinary skill in the art can also use parameters and conditions other than those described with respect to specific embodiments. As such, the above description is illustrative and not restrictive. The scope of the invention should, therefore, be determined not with reference to the above description, but instead should be determined with reference to the appended claims along with their full scope of equivalents.

What is claimed is:

1. A method for forming a silicon oxide layer over a substrate disposed in a high density plasma substrate processing chamber, said method comprising:

flowing a process gas into the substrate processing chamber, said process gas comprising a silane gas, an oxygen-containing source, and inert gas and a hydrogen containing source that is either molecular hydrogen or a hydride gas that does not include silicon, boron or phosphorus; and forming a plasma having an ion density of at least $1 \times 10^{11}$ ions/cm$^3$ from said process gas to deposit said silicon oxide layer over said substrate.

2. The method of claim 1 wherein said hydride gas is selected from the group of $H_2O$, $NH_3$, $CH_4$ and $C_2H_6$.

3. The method of claim 1 wherein said plasma is formed by application of RF energy to a coil surrounding at least a portion of said chamber.

4. The method of claim 1 wherein said silane gas is $SiH_4$.

5. The method of claim 1 wherein said oxygen-containing source is $O_2$.

6. The method of claim 1 wherein said inert gas comprises argon.

7. The method of claim 1 wherein said hydrogen-containing source is $H_2$.

8. The method of claim 1 wherein said deposited silicon oxide film contains less than or equal to 2 atomic percent hydrogen.

9. The method of claim 1 wherein a flow ratio of said oxygen-containing source to said silane gas combined with said hydrogen-containing source is between 1.6–2.5:1 inclusive.

10. The method of claim 1 wherein a flow ratio of said hydrogen-containing source to said silane gas is between 0.5–2.0:1 inclusive.

11. The method of claim 1 wherein said substrate is kept at a temperature above 450° C. during deposition of said silicon oxide layer.

12. A method for forming a silicon oxide layer over a substrate disposed in a high density plasma substrate processing chamber, said method comprising:

flowing a process gas comprising $SiH_4$, $O_2$, Ar and a hydrogen-containing source comprising one or more of $H_2$, $H_2O$, $NH_3$, $CH_4$ and $C_2H_6$ into the substrate processing chamber; and forming a plasma having an ion density of at least $1 \times 10^{11}$ ions/cm$^3$ from said process gas to deposit said silicon oxide layer over said substrate.

13. The method of claim 12 wherein said hydrogen-containing source is $H_2$.

14. The method of claim 13 wherein a ratio of a flow rate of said $O_2$ to a combined flow rate of said $SiH_4$ and $H_2$ is between 1.6–2.5:1 inclusive.

15. The method of claim 14 wherein a ratio of a flow rate of said $H_2$ to said $SiH_4$ is between 0.5–2.0:1 inclusive.

16. The method of claim 15 wherein said silicon oxide layer has a dielectric constant of between 4.0 and 4.2.

17. The method of claim 15 wherein said deposited silicon oxide layer contains less than or equal to 2 atomic percent hydrogen.

18. The method of claim 17 wherein said process gas consists essentially of $SiH_4$, $O_2$, Ar and $H_2$.

19. The method of claim 15 wherein said silicon oxide layer is deposited over a gap having a width of 0.18 microns or less and an aspect ratio of 5:1 or more and said silicon oxide layer fills said gap in a void free manner.

20. A method for forming a silicon oxide layer over a substrate disposed in a high density plasma substrate processing chamber, said method comprising:

flowing a process gas consisting of $SiH_4$, $O_2$, an inert gas and $H_2$ into the substrate processing chamber, wherein a ratio of a flow rate of said $O_2$ to a combined flow rate of said $SiH_4$ and $H_2$ is between 1.6–2.5:1 inclusive and a ratio of a flow rate of said $H_2$ to a flow rate of said $SiH_4$ is between 0.5–2.0:1 inclusive; and forming a plasma having an ion density of at least $1 \times 10^{11}$ ions/cm$^3$ from said process gas to deposit said silicon oxide layer over said substrate, wherein said deposited silicon oxide layer has a dielectric constant of between 4.0 and 4.2 and contains less than or equal to 2 atomic percent hydrogen.

21. The method of claim 11 wherein the silicon oxide layer is deposited as part of a shallow trench isolation structure.

22. A method for forming a silicon oxide layer over a substrate disposed in a high density plasma substrate processing chamber, the substrate having a trench formed between adjacent raised surfaces, said method comprising:

flowing a process gas into the substrate processing chamber, said process gas comprising a silane gas, an oxygen-containing source, an inert gas and a hydrogen containing source that is either molecular hydrogen or a hydride gas that does not include silicon, boron or phosphorus; and forming a high density plasma from the process gas to deposit the silicon oxide layer over the substrate and into the trench in a process that has simultaneous deposition and sputtering components.

23. The method of claim 22 wherein the inert gas comprises argon.

24. The method of claim 22 wherein the process gas consists of the silane gas, the oxygen-containing source, the inert gas and the hydrogen containing source.

25. The method of claim 20 wherein the inert gas comprises argon.

26. A method for forming a silicon oxide layer over a substrate disposed in a high density plasma substrate processing chamber, the substrate having a gap formed between adjacent raised surfaces, said method comprising:

flowing a process gas into the substrate processing chamber, said process gas comprising a silane gas, an oxygen-containing source and a hydrogen containing source that is either molecular hydrogen or a hydride gas that does not include silicon, boron or phosphorus, wherein a ratio of the flow rate of the hydrogen-containing source to the oxygen containing source is at least 0.5:1; and forming a high density plasma from the process gas to deposit the silicon oxide layer over the substrate and into the gap in a process that has simultaneous deposition and sputtering components.

27. The method of claim 26 wherein the ratio of the flow rate of the hydrogen-containing source to the oxygen containing source is no more than 2.0:1.

28. The method of claim 26 wherein the silane gas is monosilane ($SiH_4$).

29. The method of claim 28 wherein the oxygen source is molecular oxygen ($O_2$).

* * * * *